(12) United States Patent
Zou

(10) Patent No.: US 10,433,088 B2
(45) Date of Patent: Oct. 1, 2019

(54) PCB SPEAKER AND METHOD FOR MICROMACHINING SPEAKER DIAPHRAGM ON PCB SUBSTRATE

(71) Applicant: GOERTEK INC., WeiFang (CN)

(72) Inventor: Quanbo Zou, WeiFang (CN)

(73) Assignee: GOERTEK INC., Weifang (CN)

( * ) Notice: Subject to any disclaimer, the term of this patent is extended or adjusted under 35 U.S.C. 154(b) by 196 days.

(21) Appl. No.: 15/127,002

(22) PCT Filed: Aug. 26, 2014

(86) PCT No.: PCT/CN2014/085207
§ 371 (c)(1),
(2) Date: Sep. 16, 2016

(87) PCT Pub. No.: WO2016/029359
PCT Pub. Date: Mar. 3, 2016

(65) Prior Publication Data
US 2017/0265013 A1    Sep. 14, 2017

(51) Int. Cl.
*H04R 31/00* (2006.01)
*B81B 3/00* (2006.01)
(Continued)

(52) U.S. Cl.
CPC ......... *H04R 31/003* (2013.01); *B81B 3/0021* (2013.01); *B81C 1/00476* (2013.01);
(Continued)

(58) Field of Classification Search
CPC .................................................... H04R 31/003
See application file for complete search history.

(56) References Cited

U.S. PATENT DOCUMENTS 7,326,296 B2 * 2/2008 Quake ..................... B01D 9/00
117/200
2006/0148137 A1 7/2006 Hartzell et al.
(Continued)

FOREIGN PATENT DOCUMENTS

CN    102685655 A    9/2012
CN    103209377 A    7/2013
(Continued)

OTHER PUBLICATIONS

Office Action from Chinese Patent Office for Application No. 201480003815.3, dated Apr. 21, 2017.
(Continued)

*Primary Examiner* — Sean H Nguyen

(57) ABSTRACT

Provided is a PCB speaker and a method for micromachining the speaker diaphragm on PCB substrate, the method for micromachining the speaker diaphragm on PCB substrate comprises: providing metal paths and at least one through hole on the PCB substrate; providing a patterned sacrificial layer on the PCB substrate, the sacrificial layer covering all the through holes on the PCB substrate; providing a diaphragm layer on the sacrificial layer through depositing, mounting or laminating, the diaphragm layer covering the sacrificial layer and electrically connected with the metal paths on the PCB substrate, thereby forming a diaphragm layer; and releasing the sacrificial layer and the diaphragm layer remains. With the micromachining method for the above PCB substrate and the diaphragm, the production cost of the speaker can be lowered, and the reliability of the product can be improved at the same time.

10 Claims, 5 Drawing Sheets

(51) Int. Cl.
*B81C 1/00* (2006.01)
*H04R 7/04* (2006.01)
*H04R 19/00* (2006.01)
*H04R 19/02* (2006.01)
*H04R 7/14* (2006.01)
*H04R 1/06* (2006.01)

(52) U.S. Cl.
CPC ............ *H04R 7/04* (2013.01); *H04R 19/005* (2013.01); *H04R 19/02* (2013.01); *H04R 31/00* (2013.01); *B81B 2201/0257* (2013.01); *B81B 2203/0127* (2013.01); *B81C 2201/0107* (2013.01); *B81C 2201/019* (2013.01); *H04R 1/06* (2013.01); *H04R 7/14* (2013.01); *H04R 2201/003* (2013.01); *H04R 2499/11* (2013.01)

(56) References Cited

U.S. PATENT DOCUMENTS

| | | | | |
|---|---|---|---|---|
| 2006/0177083 | A1* | 8/2006 | Sjursen | H04R 19/016 381/322 |
| 2009/0169035 | A1* | 7/2009 | Rombach | H04R 19/005 381/175 |
| 2010/0284553 | A1* | 11/2010 | Conti | B81B 7/0061 381/174 |
| 2012/0148071 | A1* | 6/2012 | Dehe | H04R 1/005 381/116 |
| 2013/0028459 | A1* | 1/2013 | Wang | H04R 19/04 381/369 |
| 2013/0136280 | A1* | 5/2013 | Stephanou | H04R 17/00 381/190 |
| 2013/0140655 | A1* | 6/2013 | Yeh | H01L 21/56 257/416 |
| 2014/0133687 | A1 | 5/2014 | Lee | |
| 2015/0003659 | A1* | 1/2015 | Theuss | H04R 19/005 381/355 |

FOREIGN PATENT DOCUMENTS

CN 103313172 A 9/2013
CN 103686567 A 3/2014

OTHER PUBLICATIONS

International Search Report for International Patent Application No. PCT/CN2014/085207 filed on Aug. 26, 2014.
Office Action from Chinese Patent Office for Application No. 201480003815.3, dated Dec. 14, 2017.

* cited by examiner

US 10,433,088 B2

PCB SPEAKER AND METHOD FOR MICROMACHINING SPEAKER DIAPHRAGM ON PCB SUBSTRATE

CROSS-REFERENCE TO RELATED APPLICATION

The present specification is a U.S. National Stage of International Patent Application No. PCT/CN2014/085207 filed on Aug. 26, 2014, the entire contents of which are incorporated herein by reference.

TECHNICAL FIELD

The invention relates to the technical field of acoustic technique, more specifically, to a PCB speaker and a method for micromachining speaker diaphragm on PCB substrate.

BACKGROUND ART

As a common acoustic-electric transducer for converting electrical power into acoustic energy, the speaker is crucial in the sounding system. There is a variety of speakers, by which audio cones or diaphragms vibrate and resonate with the surrounding air to make sound through electromagnetic effect, piezoelectric effect or electrostatic effect. Thus, it is difficult to imagine how to enjoy wonderful sounding effects without the speaker.

Conventional miniaturized speakers/receivers for consumer applications encountered technical challenges in further size scale-down to below 6×6×1 mm^3 due to manufacturing limitations.

On one hand, the prior MEMS speaker is manufactured by wafer process and magnet integration, which makes the manufacturing process of the speaker extremely complicated. Besides, the connecting pieces for connecting respective components of the speaker are mostly made of fragile materials which, however, are unable to bear large deformation, thereby deteriorating the quality and service life of the speaker.

On the other hand, the prior MEMS speaker is a miniaturized digital speaker which requires a complicated high voltage integrated circuit (MEMS) to drive itself, while the diaphragm is susceptible to the impact from the digital switch of the digital miniaturized speaker, thereby deteriorating the quality and service life of the speaker.

Generally speaking, the prior speaker has the following problems:

1. Technical limitations and cost restraints in further size-down for conventional speakers/receivers, as driven by the consumer markets.

2. The application of MEMS technology to the speaker seems not advantageous enough due to high cost, low performance and poor reliability etc.

3. The manufacturing cost of the MEMS speaker keeps high due to the complicated wafer process.

SUMMARY OF THE INVENTION

In view of the above problems, one object of the present invention is to provide a PCB micromachining technology, a PCB speaker and a method for making and connecting its diaphragm with a PCB substrate which allows the diaphragm to generate high sound pressure upon large displacements so as to improve the sounding effects of the speaker while the manufacturing cost of the speaker is lowered.

In one aspect according to the present invention, provided is a method for micromachining speaker diaphragm on PCB substrate comprising: providing a metal path and at least one through hole on the PCB substrate; providing a patterned sacrificial layer on the PCB substrate, the sacrificial layer covering all the through holes on the PCB substrate; providing a diaphragm layer on the sacrificial layer through depositing, mounting or laminating, the diaphragm layer covering the sacrificial layer and electrically connected with the metal paths on the PCB substrate, thereby forming a diaphragm layer; and releasing the sacrificial layer and the diaphragm layer remains.

Wherein, before the sacrificial layer is released, the diaphragm layer is baked and/or patterned and/or etched and/or machined and/or cut and/or electrically connected with the metal path on the PCB substrate.

Wherein, the diaphragm layer is provided on the sacrificial layer through depositing and patterning.

Wherein, the diaphragm layer is preferably a corrugated diaphragm layer.

Wherein, the sacrificial layer is a dry film, and is released by etching, stripping or dissolving followed by drying.

Wherein, after the metal path and at least one through hole are provided on the PCB substrate, the method further comprises: providing two adhesives on the PCB substrate; providing a patterned sacrificial layer between the two adhesives, and the sacrificial layer covering all the through holes on the PCB substrate; providing a diaphragm layer on the sacrificial layer, the diaphragm layer covering the sacrificial layer and connected with the adhesives on the PCB substrate, thereby forming a diaphragm layer; and releasing the sacrificial layer and the diaphragm layer remains.

Wherein, conductive paste is provided between the diaphragm layer and the metal path on the PCB substrate.

In another aspect of the present invention, provided is a PCB speaker comprising a PCB substrate, a diaphragm and a drive device, wherein, the PCB substrate and the diaphragm are connected by the above mentioned method for micromachining speaker diaphragm on PCB substrate, and the drive device and the PCB substrate are electrically connected.

Wherein, the drive device is an IC driver and/or a flip-chip.

The PCB speaker further comprises a sealing cover, wherein, the sealing cover is attached onto the PCB substrate, and forms a sealed back chamber with the PCB substrate.

Wherein, the through holes on the PCB substrate act as an opening at the bottom of the speaker through which sounds are transmitted.

With the PCB speaker and the method for micromachining speaker diaphragm on PCB substrate according to the present invention, by micromachining the PCB substrate, the production cost of the MEMS is lowered significantly near the production cost of the PCB substrate; meanwhile, with a larger amplitude of the diaphragm, the sound pressure level is larger; after the stress generated in the diaphragm is released, the diaphragm is allowed to have larger deflection under lower level of stress, and the reliability of the product is improved at the same time. Moreover, the stress generated in the diaphragm can be controlled by mounting or laminating a metalized film, such as, PPS or PET film, on the diaphragm.

In order to achieve the above and related objects, one or more aspects of the present invention comprise the features detailed below and specified particularly in the claims Some exemplary aspects of the present invention are described in details by the description below and the accompanying drawings. However, these aspects only indicate some implementations of various implementations of the present invention. In addition, the present invention is intended to include all these aspects and their equivalents.

BRIEF DESCRIPTION OF THE DRAWINGS

By referring to the descriptions and the claims in connection with the accompanying drawings, and with a full understanding of the present invention, other purposes and results of the present invention will be more clearly and easily understood. In the drawings:

Figure 1:
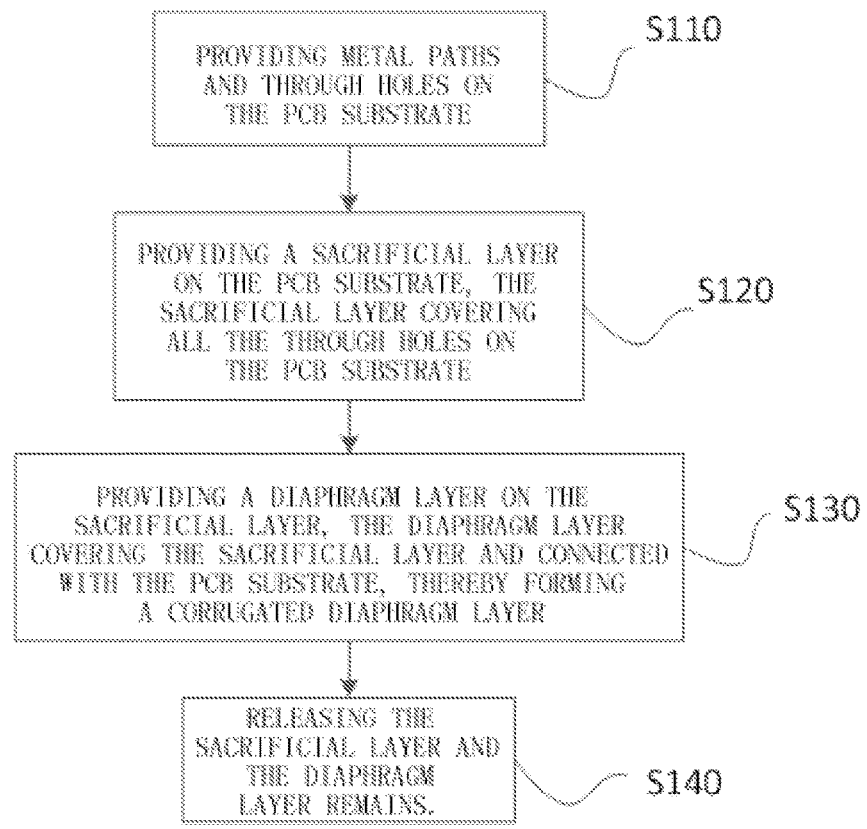
FIG. 1 is a flowchart illustrating a method for micromachining speaker diaphragm on PCB substrate according to an embodiment of the present invention.

Wherein the reference numerals comprise: metal path 1, PCB substrate 2, sacrificial layer 3, diaphragm layer 4, through hole 5, adhesive 6, flip-chip 7, IC driver 8, sealing cover 9, conductive paste 10, leading wire 11.

Throughout the drawings, similar signs indicate similar or corresponding features or functions.

DETAILED DESCRIPTION OF THE EMBODIMENTS

Various specific details are set forth in the following description to comprehensively understand one or more embodiments for sake of illustration. However, it is obvious that these embodiments can be implemented without such specific details.

In the followings, particular embodiments of the present invention are described in connection with the accompanying drawings.

The PCB (Printed Circuit Board) substrate in the PCB speaker according to the present invention is connected with the diaphragm, which is formed mainly by micromachining the PCB substrate, thereby depositing the diaphragm on the PCB substrate. Specifically, FIG. 1 illustrates the process for micromachining speaker diaphragm on PCB substrate according to the embodiment of the present invention. As illustrated in FIG. 1, the method provided by the present invention for micromachining speaker diaphragm on PCB substrate comprises:

S110: providing metal paths and at least one through hole on the PCB substrate;

S120: providing a patterned sacrificial layer on the PCB substrate, the sacrificial layer covering all the through holes on the PCB substrate;

S130: providing a diaphragm layer on the basis of the sacrificial layer through depositing, mounting or laminating, the diaphragm layer covering the sacrificial layer and connected with the metal paths on the PCB substrate, thereby forming a corrugated diaphragm;

S140: releasing the sacrificial layer and the diaphragm layer remains.

Figure 2A:
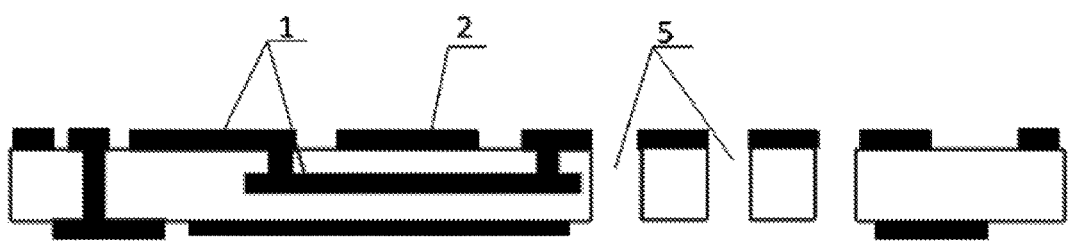
FIG. 2A is a schematic view illustrating the structure of the PCB substrate according to an embodiment of the present invention.
Figure 2B:
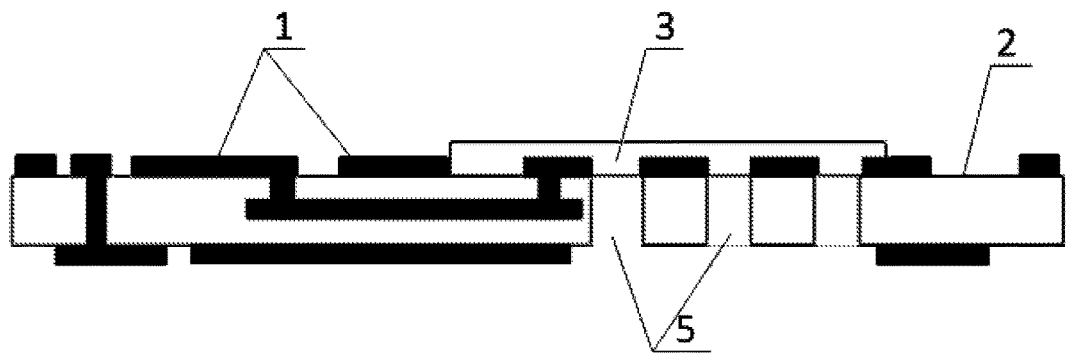
FIG. 2B is a schematic view illustrating the structure of the sacrificial layer according to an embodiment of the present invention.
Figure 2C:
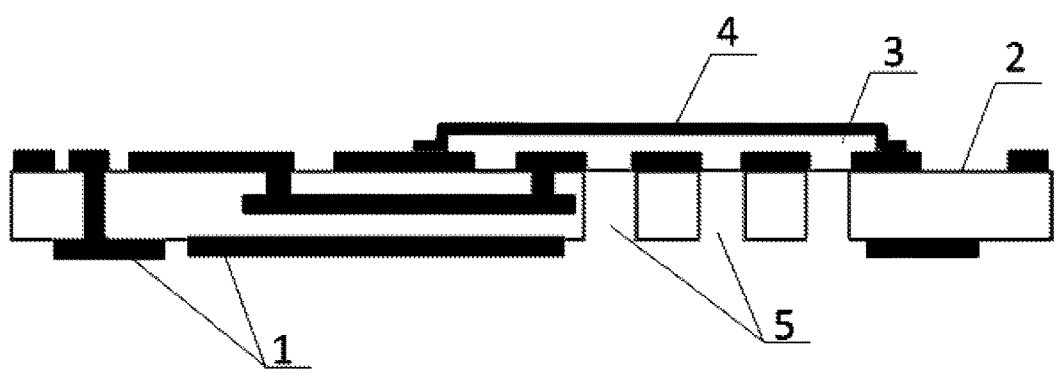
FIG. 2C is a schematic view illustrating the structure of the diaphragm layer according to an embodiment of the present invention.
Figure 2D:
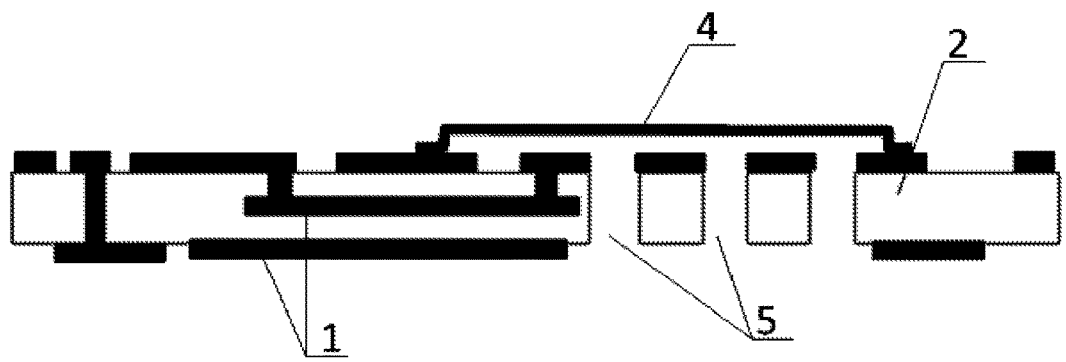
FIG. 2D is a schematic view illustrating the structure after the sacrificial layer is released according to an embodiment of the present invention.

Specifically, FIG. 2A illustrates the structure of the PCB substrate according to the embodiment of the present invention; FIG. 2B illustrates the structure of the sacrificial layer according to the embodiment of the present invention; FIG. 2C illustrates the structure of the diaphragm layer according to the embodiment of the present invention; and FIG. 2D illustrates the structure after the sacrificial layer is released according to the embodiment of the present invention.

As illustrated in FIG. 2, during the machining process for connecting the PCB substrate 2 with the diaphragm, firstly, at least one through hole 5 is provided on the PCB substrate 2. Moreover, metal paths 1 are provided on the PCB substrate 2 at a plurality of positions, thereby achieving electric connection with other devices through these metal paths 1.

On the basis of the previous step, a sacrificial layer 3 is provided on the PCB substrate 2 through metal spraying, wherein the sacrificial layer 3 covers all the through holes 5 on the PCB substrate 2, but does not fill the through holes. Then, on this basis, the diaphragm layer spanning across all the through holes 5 is arranged on the PCB substrate 2. As an example, the sacrificial layer 3 may be formed on the PCB substrate by providing a dry film.

Then, by depositing and patterning, the diaphragm layer 4 is provided on the sacrificial layer 3 and covers the sacrificial layer 3. Moreover, the coverage area of the diaphragm layer 4 goes beyond the locations of both ends of the sacrificial layer 3 and is electrically connected with the metal paths 1 of the PCB substrate 2.

After the diaphragm layer is provided, the sacrificial layer 3 is released through etching or photoresist stripping, thereby forming the structure of the corrugated diaphragm layer 4 provided on the PCB substrate 2, wherein the diaphragm layer 4 spans across all the through holes 5 on the PCB substrate 2, and is connected with the metal paths 1 of the PCB substrate 2 at both ends of the diaphragm layer 4 so as to form a diaphragm layer 4 which has a protrusion at the middle and is connected with the PCB substrate 2 at both ends.

Figure 3:
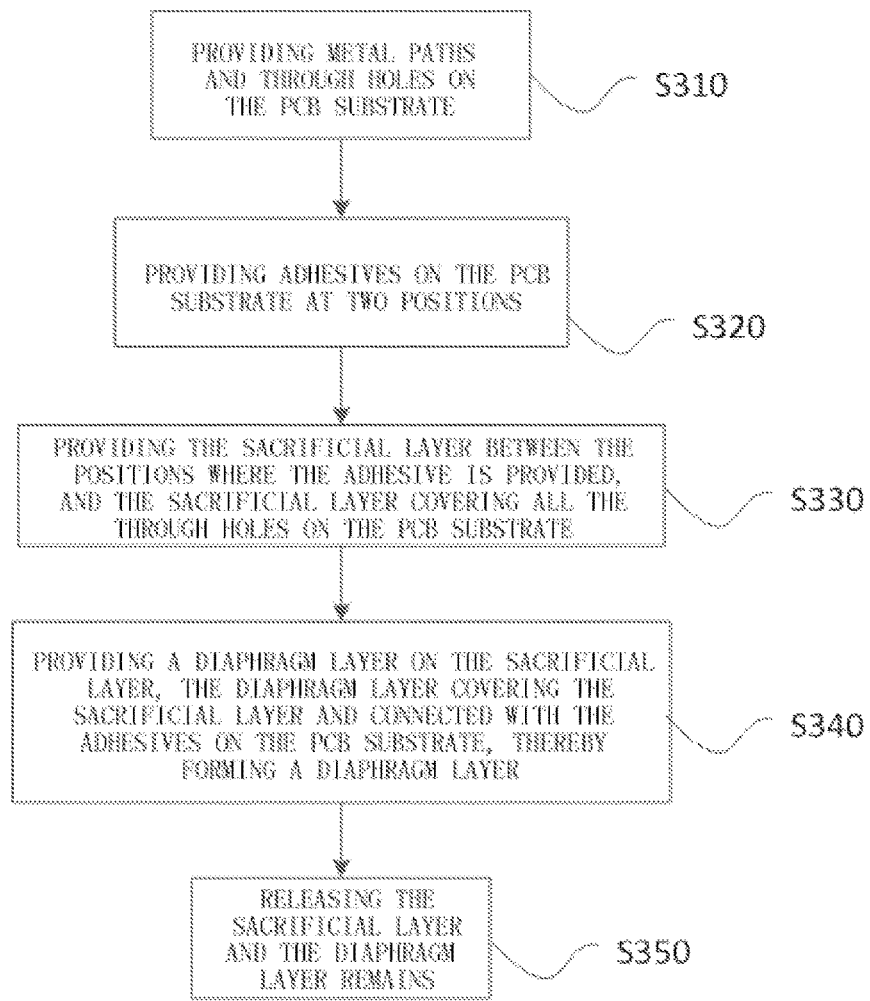
FIG. 3 is a flowchart illustrating the method for micromachining speaker diaphragm on PCB substrate according to another embodiment of the present invention.

FIG. 3 illustrates the process for micromachining speaker diaphragm on PCB substrate according to another embodiment of the present invention. As illustrated in FIG. 3, the method provided by the present invention for micromachining speaker diaphragm on PCB substrate comprises:

S310: providing metal paths and at least one through hole on the PCB substrate;

S320: providing adhesives on the PCB substrate;

S330: providing a patterned sacrificial layer between the adhesives, the sacrificial layer covering all the through holes on the PCB substrate;

S340: providing a diaphragm layer on the sacrificial layer, the diaphragm layer covering the sacrificial layer and connected with the adhesives on the PCB substrate, thereby forming a diaphragm; and S350: releasing the sacrificial layer and the diaphragm layer remains.

Specifically, FIG. 4 illustrates the process for micromachining speaker diaphragm on PCB substrate according to another embodiment of the present invention. During the process for providing the diaphragm on the PCB substrate, the diaphragm layer is not connected with the metal paths on the PCB substrate directly, but fixed by adhesives.

Figure 4A:
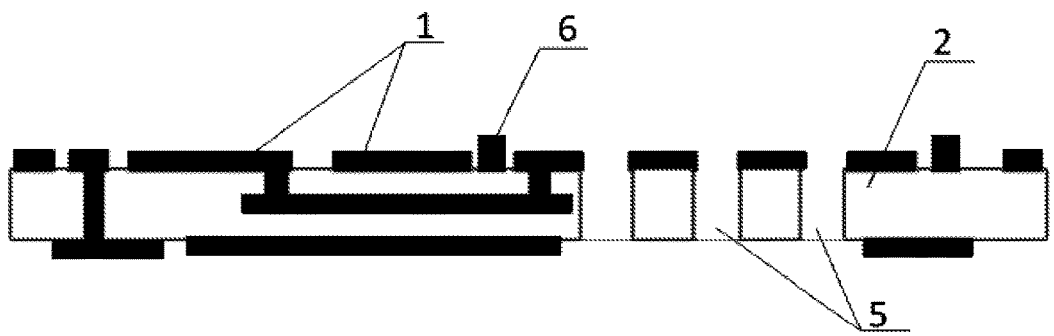
FIG. 4A is a schematic view illustrating the structure of the PCB substrate according to another embodiment of the present invention.
Figure 4B:
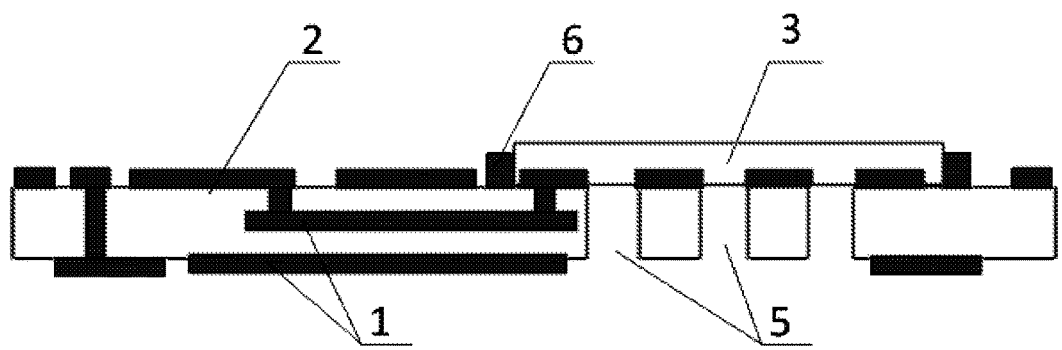
FIG. 4B is a schematic view illustrating the structure of the sacrificial layer according to another embodiment of the present invention.
Figure 4C:
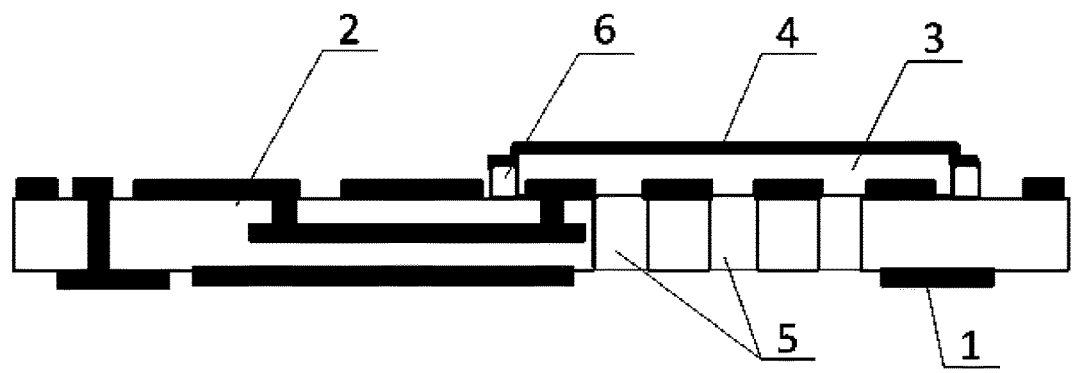
FIG. 4C is a schematic view illustrating the structure of the diaphragm layer according to another embodiment of the present invention.
Figure 4D:
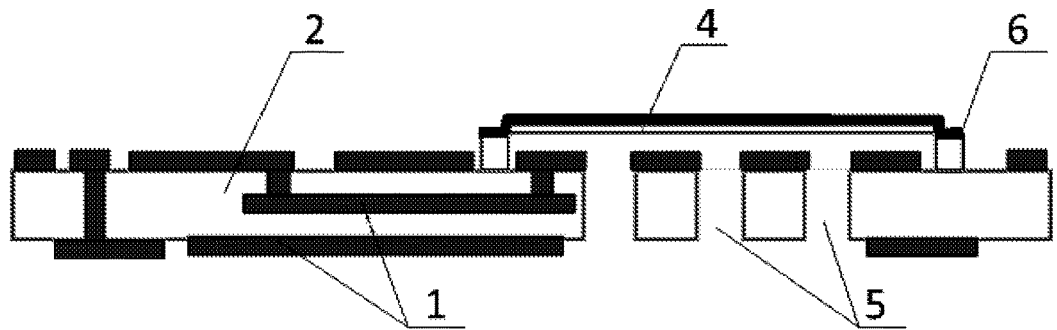
FIG. 4D is a schematic view illustrating the structure after the sacrificial layer is released according to another embodiment of the present invention.

Specifically, FIG. 4A illustrates the structure of the PCB substrate according to another embodiment of the present invention; FIG. 4B illustrates the structure of the sacrificial layer according to another embodiment of the present invention; FIG. 4C illustrates the structure of the diaphragm layer according to another embodiment of the present invention; and FIG. 4D illustrates the structure after the sacrificial layer is released according to another embodiment of the present invention.

As illustrated in FIG. 4, during the process for micromachining the diaphragm on PCB substrate, firstly, adhesive 6 is provided at two positions on the PCB substrate 2 provided with through holes 5 and metal paths 1, wherein all the through holes 5 on the PCB substrate 2 are provided between the two positions where the adhesive 6 is provided.

Then, the sacrificial layer 3 is provided on the PCB substrate 2 through metal spraying, wherein the sacrificial layer 3 covers all the through holes 5 on the PCB substrate 2, and thereafter, the diaphragm layer 4 spanning across all the through holes 5 are mounted on the PCB substrate 2. As an example, the sacrificial layer 3 may be formed by providing a dry film on the PCB substrate.

On the basis of the sacrificial layer 3, the metalized diaphragm layer 4 is fixed on the sacrificial layer 3 by adhesive 6 under tensile, and then the diaphragm layer 4 is cut such that the diaphragm layer 4 covers the sacrificial layer 3 and is connected with the adhesives 6 at two ends of the diaphragm layer 4.

After the diaphragm layer 4 is provided, the sacrificial layer 3 is released by etching or photoresist stripping, thereby forming the structure of the corrugated diaphragm layer 4 provided on the PCB substrate 2, wherein the diaphragm layer 4 spans across all the through holes 5 on the PCB substrate 2, and is connected with the adhesives 6 at both ends of the diaphragm layer 4 so as to form a diaphragm layer 4 which is higher at the middle and lower at both ends. The corrugated diaphragm layer according to the embodiment of the present invention has only one crest, and the adhesives are provided at two troughs of the diaphragm layer. By forming the corrugated diaphragm layer, the stress in the diaphragm is under control and the tension generated in the diaphragm layer during vibration is released.

It is to be noted that in the process for connecting the adhesives 6 with the PCB substrate 2, conductive paste 10 is provided between the diaphragm layer 4 and the metal paths 1 of the PCB substrate 2, thereby achieving electrical connection between the diaphragm layer 4 and the PCB substrate 2.

Moreover, it is to be noted that in the processing method for micromachining the diaphragm on the PCB substrate, the sacrificial layer may be released through various methods such as etching, stripping and dissolving. During the process for providing the diaphragm layer on the sacrificial layer by etching and patterning, the diaphragm may be deposited by PVD (Physical Vapor Deposition) using cobalt or nickel and the like, and the patterning process may be implemented by stripping technique. The speaker provided by the present invention is not limited to the above processing method, and other film processing methods may be used as long as the product quality is not affected.

In the diaphragm layer provided by the present invention, metal or metalized high polymer material may be used as a movable electrode, wherein the metal diaphragm layer is formed by PVD, and then patterned by lithography, and etched. The diaphragm made of metalized high polymer material is formed with adhesives which allow a certain amount of tension to be formed in the diaphragm layer, or is formed by lamination. Then, necessary machining (such as, laser cutting, etc) is required for the diaphragm layer, and the diaphragm layer is electrically connected with the metal paths on the PCB substrate.

By micromachining the PCB substrate, the corrugated diaphragm is deposited on the PCB substrate, thereby lowering the production cost of the speaker significantly. Meanwhile, the corrugated diaphragm allows the stress generated in the diaphragm during vibration to be released, thereby increasing the amplitude of the diaphragm, which allows the diaphragm to have larger deflection under lower level of stress, thus lowering production cost and improving the reliability of the product at the same time. However, in yet another embodiment of the invention, the diaphragm may not be corrugated.

A PCB speaker comprises a PCB substrate, a diaphragm and a drive device, wherein the PCB substrate is connected with the diaphragm by the abovementioned method, and the drive device is provided on and electrically connected with the PCB substrate. Further, a sealing cover is provided, and the sealing cover is attached onto the PCB substrate. A sealed chamber structure of the speaker is formed by the sealing combination of the sealing cover and the PCB substrate. Particularly, FIG. 5 illustrates the structure of the PCB speaker according to the embodiment of the present invention.

Figure 5:
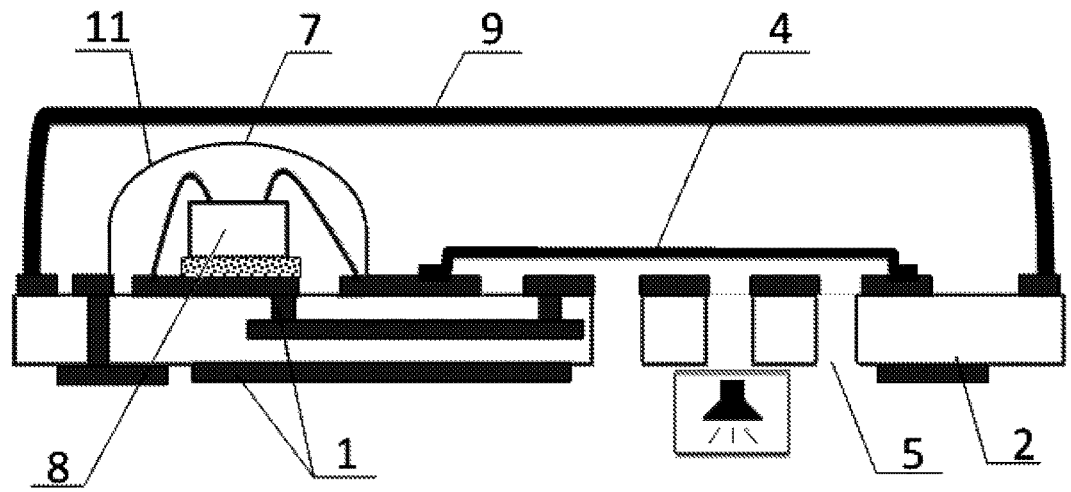
FIG. 5 is a schematic view illustrating the structure of the PCB speaker according to an embodiment of the present invention.

As illustrated in FIG. 5, the PCB speaker provided by the present invention comprises a PCB substrate 2, a diaphragm layer 4, a sealing cover 9 and a drive device. Wherein, metal paths 1 and a plurality of through holes 5 are provided on the PCB substrate 2, the diaphragm layer is provided on the PCB substrate 2 in a corrugated form, and spans across all the through holes 5 of the PCB substrate 2, and is electrically connected with the metal paths 1 of the PCB substrate 2. During the process for connecting the PCB substrate 2 with the diaphragm layer 4, firstly, a sacrificial layer is provided on the PCB substrate 2, and the sacrificial layer covers all the through holes 5 of the PCB substrate 2. Then, the diaphragm layer 4 is provided on the sacrificial layer 3, and the diaphragm layer 4 covers the sacrificial layer 3 and is electrically connected with the metal paths 1 of the PCB substrate 2, thereby forming the corrugated diaphragm layer 4. Finally, the sacrificial layer 3 is released and the diaphragm layer 4 remains.

It is to be noted that the drive device is an IC driver 8 and/or a flip-chip 7. In the case that the IC driver 8 is used for driving, the IC driver 8 is provided on the PCB substrate 2, and the drive device is electrically connected with the metal paths 1 of the PCB substrate 2 by leading wires 11. Alternatively, the flip-chip 7 may also be used for driving at the same time, wherein the flip-chip 7 is electrically connected with the metal paths 1 of the PCB substrate 2 directly.

After the sealing cover 9 is fixed on the PCB substrate 2, the sealing cover 9 and the PCB substrate 2 form the back chamber of the speaker, enabling sounding through the openings at the bottom, wherein the openings at the bottom are the through holes 5 on the PCB substrate 2.

Figure 6:
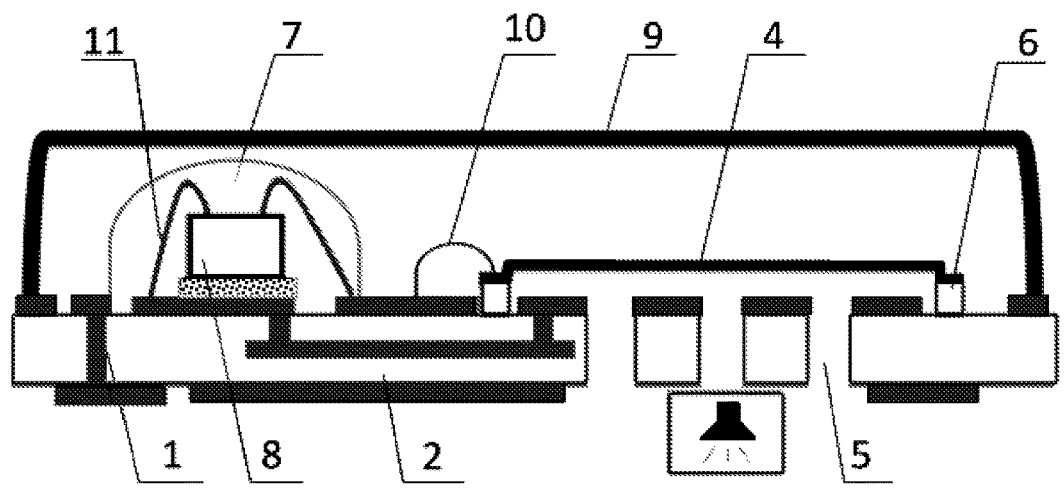
FIG. 6 is a schematic view illustrating the structure of the PCB speaker according to another embodiment of the present invention.

FIG. 6 illustrates the structure of the PCB speaker according to another embodiment of the present invention. As illustrated in FIG. 6, the PCB speaker in the embodiment comprises a PCB substrate 2, a diaphragm layer 4, a sealing cover 9 and a drive device. Wherein, metal paths 1 and a plurality of through holes 5 are provided on the PCB substrate 2, the diaphragm layer 4 is provided on the adhesives 6 of the PCB substrate 2 in a corrugated form, and spans across all the through holes 5 of the PCB substrate 2. During the process for connecting the PCB substrate 2 with the diaphragm layer 4, firstly, adhesives 6 are provided on the PCB substrate 2 at two positions, the sacrificial layer is provided between two positions where the adhesive 6 is provided, and the sacrificial layer covers all the through holes 5 of the PCB substrate 2. Then, the diaphragm layer 4 is provided on the sacrificial layer, and the diaphragm layer 4 covers the sacrificial layer and is connected with the adhesives 6 of the PCB substrate 2 to form the corrugated diaphragm layer 4. Finally, the sacrificial layer is released and the diaphragm layer 4 remains.

It is to be noted that the drive device is an IC driver 8 and/or a flip-chip 7. In the case that the IC driver 8 is used for driving, the IC driver is provided on the PCB substrate 2, and the IC driver 8 is electrically connected with the metal paths 1 of the PCB substrate 2 by leading wires 11. In addition, the flip-chip 7 can be used for driving alone or together with the IC driver 8, wherein the flip-chip 7 is electrically connected with the metal paths 1 of the PCB substrate 2 directly.

It is to be noted that during the process for connecting the diaphragm layer 4 with the PCB substrate 2 by the adhesives 6, conductive paste 10 is also provided. By providing the conductive paste 10 between the diaphragm layer 4 and the metal paths 1 of the PCB substrate 2, electrical connection therebetween is achieved. Wherein, in the embodiment of the present invention, the conductive paste 10 is silver paste by which the PCB substrate is electrically connected with the diaphragm layer.

After the sealing cover 9 is fixed on the PCB substrate 2, the sealing cover 9 and the PCB substrate 2 form the back chamber of the speaker, enabling sounding through the openings at the bottom, wherein the openings are the through holes 5 of the PCB substrate 2. In the machining process of the PCB substrate, the through holes and the metalizing process for the surfaces of the PCB substrate according to the present invention, the PCB substrate can be used as an electrode, and the through holes can be used as the openings of the speaker at the same time for transmitting sounds.

In addition, it is to be noted that the method for micromachining speaker diaphragm on PCB substrate in the present invention may also be used for the manufacturing process of the microphone, which has the advantages of low production cost and large amplitude of the diaphragm, thereby improving the acoustic performance of the speaker or microphone.

As described above, the PCB speaker and the method for micromachining the diaphragm of the PCB speaker on the PCB substrate are described by way of example with reference to the accompanying drawings. However, it should be understood by those skilled in the art that various improvements can be made to the PCB speaker and the method for micromachining the diaphragm of the PCB speaker on the PCB substrate provided by the present invention as described above without departing from the spirits of the present invention. Accordingly, the scope of protection of the present invention should be defined by the appended claims.

The invention claimed is:

1. A method for Printed Circuit Board (PCB) micromachining, and micromachining speaker diaphragm on PCB substrate, comprising:
   providing a metal path and at least one through hole on the PCB substrate;
   after providing the metal path and at least one through hole, providing adhesives on the PCB substrate;
   providing a patterned sacrificial layer on the PCB substrate between the adhesives, the sacrificial layer covering all the through holes on the PCB substrate;
   providing a diaphragm layer on the sacrificial layer through depositing, mounting or laminating, the diaphragm layer covering the sacrificial layer and electrically connected with the metal path on the PCB substrate; and
   releasing the sacrificial layer and the diaphragm layer remains,
   wherein the diaphragm layer spans across all the through holes and is attached to the PCB substrate by the adhesives so that tension is applied to the diaphragm layer.

2. The method according to claim 1, wherein,
   before the sacrificial layer is released, the diaphragm layer is baked and/or patterned and/or etched and/or machined and/or cut, and/or electrically connected to the metal path on the PCB substrate.

3. The method according to claim 1, wherein,
   the diaphragm layer is provided on the sacrificial layer through depositing and patterning.

4. The method according to claim 1, wherein,
   the sacrificial layer is a dry film, and is released through etching, stripping or dissolving followed by drying.

5. The method for according to claim 1, wherein,
   conductive paste is provided between the diaphragm layer and the metal path on the PCB substrate.

6. The method according to claim 1, wherein the diaphragm layer is a corrugated diaphragm layer.

7. A Printed Circuit Board (PCB) speaker comprising a PCB substrate, a diaphragm and a drive device, wherein,
   the PCB substrate and the diaphragm are connected by the method according to claim 1, and the drive device and the PCB substrate are electrically connected.

8. The PCB speaker according to claim 7, wherein,
   the drive device is an IC driver and/or a flip-chip.

9. The PCB speaker according to claim 7, further comprising a sealing cover, wherein,
   the sealing cover is attached onto the PCB substrate, and defines with the PCB substrate a sealed back chamber.

10. The PCB speaker according to claim 7, wherein,
    the at least one through hole on the PCB substrate acts as an opening at the bottom of the speaker for transmitting sounds.

* * * * *